United States Patent [19]
Lee

[11] Patent Number: 5,210,613
[45] Date of Patent: May 11, 1993

[54] ZIGZAG INTERLINE TRANSFER TYPE CCD IMAGE SENSOR

[75] Inventor: Sung M. Lee, Seoul, Rep. of Korea

[73] Assignee: Goldstar Electron Co., Ltd., Chungcheongbuk, Rep. of Korea

[21] Appl. No.: 774,627

[22] Filed: Oct. 10, 1991

[30] Foreign Application Priority Data

Oct. 13, 1990 [KR] Rep. of Korea .......... 16260/1990[U]

[51] Int. Cl.$^5$ ............................................. H04N 5/335
[52] U.S. Cl. ........................... 358/213.23; 358/213.11; 358/213.26
[58] Field of Search ................... 358/213.11, 213.22, 358/213.23, 213.26, 213.28; 357/24 LR

[56] References Cited

U.S. PATENT DOCUMENTS 4,811,068  3/1989  Kinoshita ............................. 357/24

FOREIGN PATENT DOCUMENTS

61-93781  5/1986  Japan.
62-58787  3/1987  Japan.
63-226061 9/1988  Japan.
3-123278  5/1991  Japan.

Primary Examiner—Michael T. Razavi
Assistant Examiner—Tuan U. Ho

[57] ABSTRACT

A CCD image sensor includes a plurality of uniformly spaced photodiodes arranged in series in vertical and horizontal directions, a horizontal signal transferring region formed integrally in a zigzag from between adjacent sets of said plurality of horizontally arranged photodiodes, a signal flowing direction changing region formed under the last set of the plurality of horizontally arranged photodiodes and at output of the horizontal signal transferring region, a signal processing region for storing temporarily signal charges from the horizontal signal transferring region or the signal charges from the signal flowing direction changing region and then resetting the signal charges, and a sensing amplifier for sensing states of the signal charges being temporarily stored in the signal processing region and amplifying the sensed states of the signal charges by a predetermined amplification degree, whereby the CCD image sensor is capable of being driven by a small number of clock signals so that it can be applied to a system requiring a lower resolution.

12 Claims, 12 Drawing Sheets

ZIGZAG INTERLINE TRANSFER TYPE CCD IMAGE SENSOR

BACKGROUND OF THE INVENTION

1. Field of the Invention

The present invention relates to a charge coupled device image sensor and more particularly, to a charge coupled device (hereinafter "CCD") image sensor of an interline transfer type.

2. Description of the Prior Art

Generally, the signal transfer of a charge coupled device (CCD) image sensor may be of three types, a frame transfer type, an interline transfer type, and a frame-interline transfer type.

The CCD image sensor of the frame transfer type has a plurality of photodetectors formed on a plane thereof and a plurality of signal transfer regions formed under the photodetectors. As a result, the CCD image sensor of the frame transfer type may be applied to a system requiring a higher resolution such as broadcasting equipment, or a system of a non-interlaced scanning type such as military equipment.

The CCD image sensor of the interline transfer type has a plurality of photodetectors and a respective plurality of signal transfer regions, formed on a plane thereof. As a result, the CCD image sensor of the interline transfer type may be applied to a commercial system requiring a lower resolution rather than the broadcasting equipment and military equipment, and it may particularly be applied to a television set or a camcorder of an interlaced scanning type. The CCD image sensor of the frame transfer type may also be applied to a commercial system requiring about one million pixels such as a high definition television (HDTV).

In a video cassette recorder (hereinafter "VCR") utilizing the CCD image sensor of the interline transfer type, there have typically been required two hundred and fifty thousand pixels for VHS tape or three hundred and eighty thousand pixels for super VHS tape.

A construction of a conventional CCD image sensor of the interline transfer type will now be described with reference to FIGS. 1A-1D.

Figure 1A:
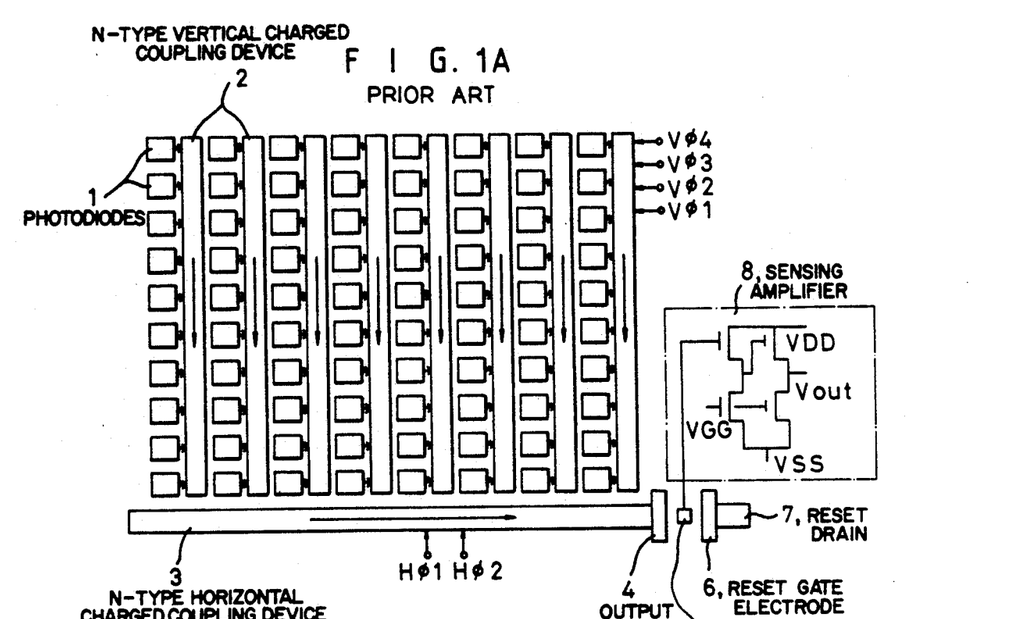
FIG. 1A is a schematic diagram of a construction of a conventional CCD image sensor of an interline transfer type.

With reference to FIG. 1A, there is shown a schematic diagram of a construction of the conventional CCD image sensor of the interline transfer type. The conventional CCD image sensor comprises a N-type horizontal charge coupled device (hereinafter "HCCD") region 3 and a plurality of N-type vertical charge coupled device (hereinafter "VCCD") regions 2, each to which a series of N-type photodiodes 1 are connected. Each of the N-type photodiodes 1 is connected to the N-type VCCD region 2 such that an image signal charge outputted therefrom is transferred to the N-type VCCD region 2 in a single direction. Also, the N-type VCCD regions 2 are connected to the N-type HCCD region 3 such that the signal charges transferred from the photodiodes 1 are transferred to the N-type HCCD region 3 simultaneously in response first to four VCCD clock signals $V\phi1$-$V\phi4$, each clock signal corresponding to one phase.

Also, at output of the N-type HCCD region 3 are, connected in series, an output gate 4, a floating diffusion region 5, a reset gate electrode 6 and a reset drain 7. In addition, a sensing amplifier 8 is connected to the floating diffusion region 5.

Figure 1B:
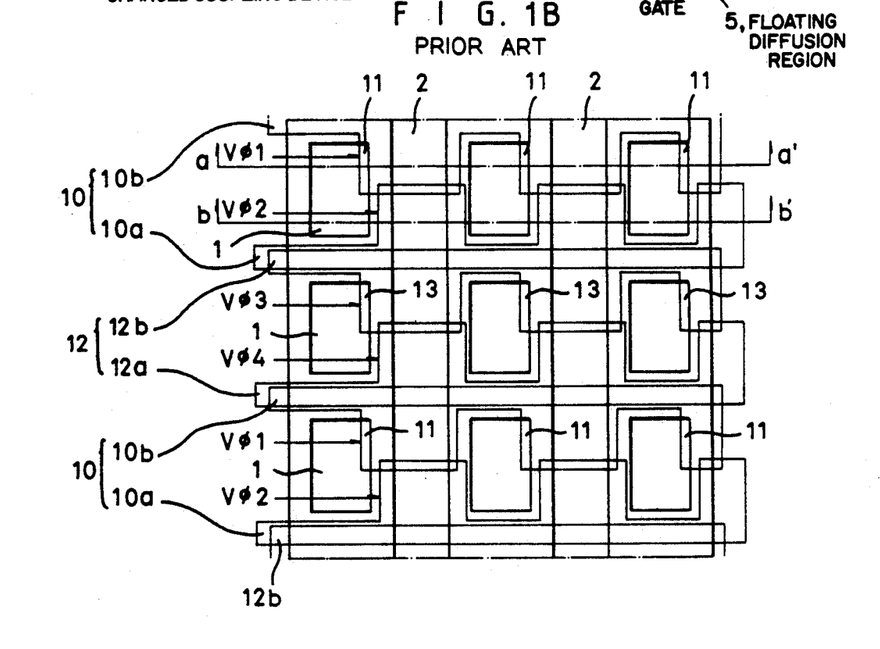
FIG. 1B is a layout diagram of the construction of the conventional CCD image sensor in FIG. 1A.

With reference to FIG. 1B, there is shown a layout diagram of the construction of the conventional CCD image sensor in FIG. 1A. The CCD image sensor comprises a channel stop region 9 formed between each of the N-type VCCD regions 2 and each of the corresponding N-type photodiodes 1. An odd gate electrode 10 is formed over each of the N-type VCCD regions 2 and each of the channel stop regions 9 such that it is connected to each of transfer gates 11 of the N-type photodiodes 1 arranged on an odd horizontal line, the odd gate electrode 10 being applied with the first and the second clock signals $V\phi1$-$V\phi2$. On the other hand, an even gate electrode 12 is formed over each of the channel stop regions 9, each of the N-type VCCD regions 2 and each of the N-type photodiodes 1 such that it is connected to each of transfer gates 13 of the N-type photodiodes 1 arranged on an even horizontal line, the even gate electrode 12 being applied with the third and the fourth clock signals $V\phi3$-$V\phi4$.

The forming of the odd gate electrode 10 and the even gate electrode 12 may be repeated successively, as they are required, in the same form. Also, these electrodes 10 and 12 are generally electrically isolated from each other by a region (not shown) of an insulating material, such as silicon oxide.

On the other hand, materials of the transfer gates 11 and 13 and the odd and even gate electrodes 10 and 12 may be polysilicons.

The odd gate electrode 10 includes a first odd gate electrode 10a formed under each of the N-type photodiodes 1 on the odd horizontal line and a second odd gate electrode 10b formed over each of the N-type photodiodes 1 on the odd horizontal line and connected to each of the transfer gates 11 of the photodiodes 1 on the odd horizontal line, the first odd gate electrode 10a being applied with the second VCCD clock signal $V\phi2$ and the second odd gate electrode 10b being applied with the first VCCD clock signal $V\phi1$.

The even gate electrode 12 includes a first even gate electrode 12a formed under each of the N-type photodiodes 1 on the even horizontal line and a second even gate electrode 12b formed over each of the N-type photodiodes 1 on the even horizontal line and connected to each of the transfer gates 13 of the photodiodes 1 on the even horizontal line, the first even gate electrode 12a being applied with the fourth VCCD clock signal $V\phi4$ and the second even gate electrode 12b being applied with the third VCCD clock signal $V\phi3$.

Also, the first through the fourth VCCD clock signal $V\phi1$-$V\phi4$ of four phases corresponds to two fields, i.e. an even field and an odd field. The clocking operation of the N-type VCCD region 2 will be described hereinafter in more detail.

Figure 1C:
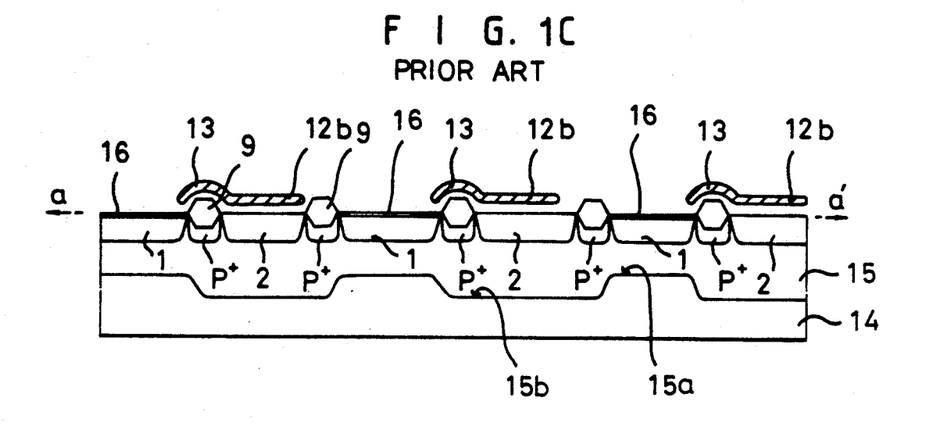
FIG. 1C is a sectional view, taken along line a—a' in FIG. 1B.

With reference to FIG. 1C, there is shown a sectional view, taken along line a—a' in FIG. 1B. The conventional CCD image sensor comprises a N-type substrate 14 and a P type well 15, formed on the N-type substrate 14. Also on the N-type substrate 14 are configured a series of arrangement that the N-type photodiode 1 and the N-type VCCD region 2 on the even horizontal line are connected to each other at a desired interval via the channel stop region 9. Each of the transfer gates 13 is formed over each of the N-type photodiodes 1 and each of the N-type VCCD regions 2 to connect them with each other. Also, over the surface of each of the N-type VCCD regions 2 is formed the second even gate electrode 12b of the even gate electrode 12 being applied with the third VCCD clock signal $V\phi3$, to be connected to each of the transfer gates 13 of the N-type photodiodes 1 arranged on the even horizontal line.

The P-type well 15 is comprised of two types, a P-type shallow well 15a and a P-type deep well 15b, for the control of over flow drain (hereinafter "OFD") voltage.

On the surface of each of the N-type photodiodes 1 is generally formed a P+-type thin layer 16 for applying an initial bias. As shown in FIG. 1C, the lower side of the channel stop region 9 designated as the character P+ indicates a P+-channel stop ion.

Figure 1D:
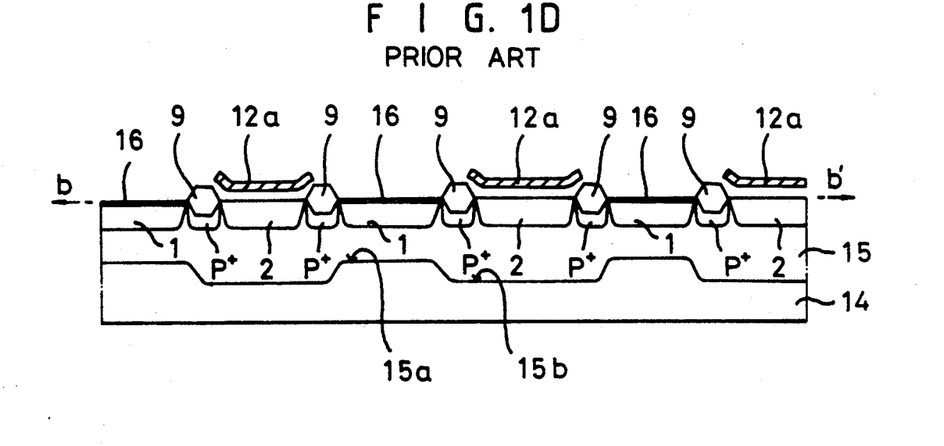
FIG. 1D is a sectional view, taken along line b—b' in FIG. 1B.

With reference to FIG. 1D, there is shown a sectional view, taken along line b—b' in FIG. 1B. The P-type well 15 is formed on the N-type substrate 14, identically to FIG. 1C. Also, on the N-type substrate 14 are configured a series of arrangement that the N-type photodiode 1 and the N-type VCCD 2 on the even horizontal line are connected to each other at a desired interval via the channel stop region 9. Also, over the surface of each of the N-type VCCD regions 2 is formed the first even gate electrode 12a of the even gate electrode 12 being applied with the fourth VCCD clock signal Vφ4.

Similarly, on the surface of each of the N-type photodiodes 1 is generally formed P+-type thin layer 16 for the applying an initial bias. In FIG. 1D, the lower side of the channel stop region 9 designated as the character P+ indicates a P+-channel stop ion. Herein, the P-type well 15 is comprised of the P-type shallow well 15a and the P-type deep well 15b, for the control of OFD voltage.

The transfer gate 11 of each of the N-type photodiodes 1 arranged on the odd horizontal line is driven only by the first VCCD clock signal Vφ1 being applied to the second odd gate electrode 10b of the odd gate electrode 10, and the transfer gate 13 of each of the N-type photodiodes 1 arranged on the even horizontal line is driven only by the third VCCD clock signal Vφ3 being applied to the second even gate electrode 12b of the even gate electrode 12.

The second VCCD clock signal Vφ2 being applied to the first odd gate electrode 10a of the odd gate electrode 10 and the fourth VCCD clock signal Vφ4 being applied to the first even gate electrode 12a of the even gate electrode 12 serve merely to transfer image signal charges traveling from the N-type photodiodes 1 arranged on the odd and even horizontal lines toward the HCCD region 3.

The operation of the conventional CCD image sensor of the above-mentioned construction will now be described with reference to FIGS. 2A-2C.

Figure 2A:
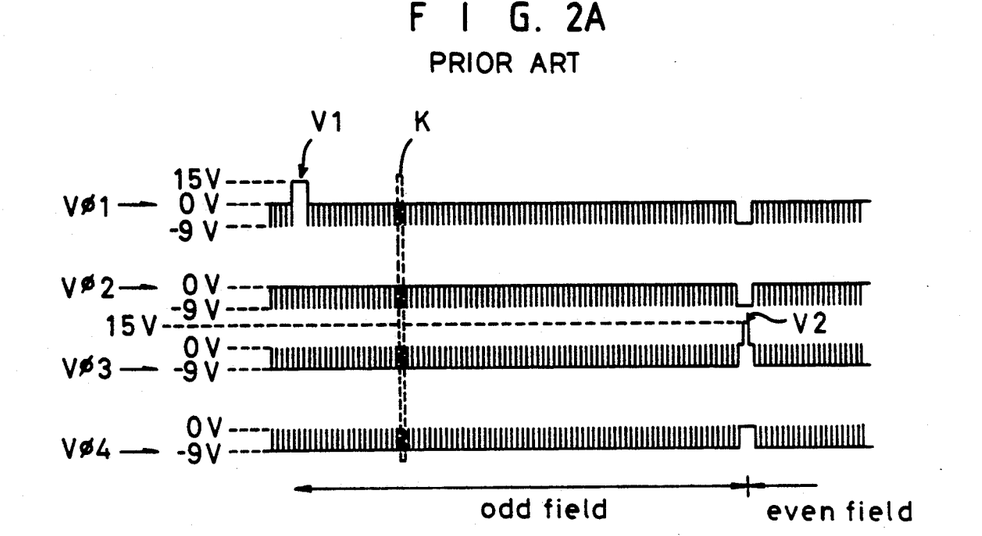
FIG. 2A is a timing diagram of VCCD clock signals in the conventional CCD image sensor in FIG. 1A.

With reference to FIG. 2A, there is shown a timing diagram of the first through fourth VCCD clock signal Vφ1-Vφ4 of four phases, each including two fields, an even field and an odd field.

In this drawing, in the odd field of the first VCCD clock signal Vφ1 being applied to the second odd gate electrode 10b of the odd gate electrode 10 is contained a transfer gate drive voltage V1 of high level (15 V). Also, in the even field of the third VCCD clock signal V3 being applied to the second even gate electrode 12b of the odd gate electrode 12 is contained a transfer gate drive voltage V2 of high level (15 V).

First, when the first through fourth VCCD clock signals Vφ1-Vφ4 in the odd field are applied simultaneously, the transfer gates 10 of the N-type photodiodes 1 arranged on each of the odd horizontal lines are turned on simultaneously by the transfer gate drive voltage V1 contained in the first VCCD clock signal Vφ1.

For this reason, the image signal charges produced from the N-type photodiodes 1 are transferred to the N-type VCCD regions 2 and then toward the N-type HCCD region 3 by the VCCD clocking operation. The image signal charges transferred to the HCCD region 3 are then transferred to the output gate 4 in response to HCCD clock signals Hφ1 and Hφ2. The process of the image signal charges being outputted from the HCCD region 3 will be mentioned later in detail.

Figure 2B:
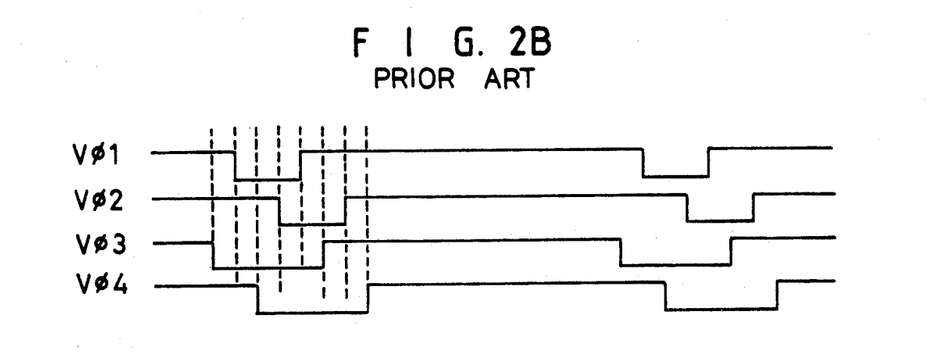
FIG. 2B is a pulse waveform diagram of the VCCD clock signals at the unit interval K of FIG. 2A.

With reference to FIG. 2B, there is shown a pulse waveform diagram of the first through fourth VCCD clock signals Vφ1-Vφ4 at the unit interval K of FIG. 2A. The image signal charges produced from the N-type photodiodes 1 are transferred vertically toward the N-type HCCD region 3 by a series of clocking operation as shown in FIG. 2B.

At this time, the second VCCD clock signal Vφ2 being applied through the first odd gate electrode 10a of the odd gate electrode 10 formed in the lower side of the odd horizontal line serves merely to transfer the image signal charges transferred from the N-type photodiodes 1 arranged on the even horizontal line by the first VCCD clock signal Vφ1 to the N-type HCCD region 3, together with the first VCCD clock signal Vφ1.

Thereafter, if the first through fourth VCCD clock signal Vφ1-Vφ4 in the even field as shown in FIG. 2A are applied simultaneously, the transfer gates 13 of the N-type photodiodes 1 arranged on each of the even horizontal lines are turned on simultaneously by the transfer gate drive voltage V2 contained in the third VCCD clock signal Vφ3.

For this reason, the image signal charges produced from the N-type photodiodes 1 on the even horizontal line are transferred to the N-type VCCD regions 2 and then toward the N-type HCCD region 3 by the VCCD clocking operation as shown in FIG. 2B, in the same manner as that of the odd field.

At this time, the fourth VCCD clock signal Vφ4 being applied through the first even gate electrode 12a of the even gate electrode 12 formed in the lower side of the even horizontal line serves merely to transfer the image signal charges transferred from the N-type photodiodes 1 arranged on the even horizontal line by the third VCCD clock signal Vφ3 to the N-type HCCD region 3, together with the third VCCD clock signal Vφ3.

As stated, the use of the VCCD clock signals of four phases has the effect of transferring the image signal charge in amount more than that of the VCCD clock signals of two phases, i.e., the first and third VCCD clock signal Vφ1 and Vφ3.

As a result, as mentioned above, by the VCCD clocking signals of four phases, i.e. the first through fourth VCCD clock signals Vφ1-Vφ4 as shown in FIG. 2A, the image signal charges from the N-type photodiodes 1 arranged on the odd horizontal line are first in sequence scanned on the screen through the N-type VCCD regions 2 and then through the N-type HCCD region 3 and then the image signal charges from the N-type photodiodes 1 arranged on the even horizontal line are in sequence scanned on the screen through the N-type VCCD regions 2 and then through the N-type HCCD region 3.

As previously stated, the scanning of the CCD image sensor as mentioned above is usually referred to as the interlaced scanning type.

Figure 2C:
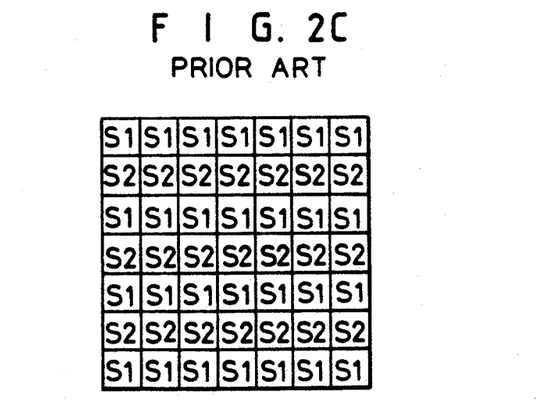
FIG. 2C is a pixel format of one picture, or one frame in the conventional CCD image sensor in FIG. 1A.

Referring in detail to FIG. 2C, there is shown a pixel format of one picture, or one frame, the picture being comprised of pixels, each being displayed as the numerals S1 and S2, each designating the image signal charges from the N-type photodiodes 1 arranged on the odd and even horizontal lines as shown in FIG. 1A, respectively.

However, the conventional CCD image sensor of the interline transfer type has a disadvantage, in that it requires a number of clock signals, i.e., a total of seven clock signals, four VCCD clock signals $V\phi 1$-$V\phi 4$, two HCCD clock signals $H\phi 1$ and $H\phi 2$ and one reset clock signal $R\phi$, resulting in its high manufacturing cost and complexity. Namely, a system utilizing the CCD image sensor of the interline transfer type has to comprise a signal generator to generate the number of clock signals and a number of its peripheral devices, resulting in its high manufacturing cost and complexity. The CCD image sensor of the interline transfer type may be applied to a system requiring a higher resolution. In a system which does not require the higher resolution, such as, for example, a toy set or a machine-vision system, there is no necessity for necessarily using the CCD image sensor of the interline transfer type. For example, the toy set requires only resolution for recognition of an appearance of an object and the machine-vision system such as a robot system requires only resolution for recognition of a position and a direction of the object.

SUMMARY OF THE INVENTION

Accordingly, it is an object of the present invention to provide a CCD image sensor which is capable of being driven by a small number of clock signals, so that it can be applied to system requiring a lower resolution, which eliminates the above problems encountered in conventional CCD image sensor.

Another object of the present invention is to provide a CCD image sensor which includes a plurality of uniformly spaced photodetecting means arranged in series in vertical and horizontal directions, for producing signal charges corresponding to incident light incoming along a predetermined path; horizontal signal transferring means formed integrally in a zigzag form between adjacent sets of the plurality of horizontally arranged photodetecting means, for transferring the signal charges being applied from the plurality of photodetecting means in a single direction in response to first and second external clock signals; signal flowing direction changing means formed under the last set of the plurality of horizontally arranged photodetecting means and at output of the horizontal signal transferring means, for selectively reversing flow of the signal charges outputted from the horizontal signal transferring means in the opposite direction in response to a third external clock signal; signal processing means for storing temporarily the signal charges from the horizontal signal transferring means or the signal charges from the signal flowing direction changing means and then resetting the signal charges; and sensing amplifying means for sensing states of the signal charges being temporarily stored in the signal process means and amplifying the sensed states of the signal charges by a predetermined amplification degree.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Referring now in detail to the drawings for the purpose of illustrating preferred embodiments of the present invention, the CCD image sensor as shown in FIGS. 3–6 comprises a plurality of uniformly spaced N-type photodiodes 17 arranged in series in vertical and horizontal directions for producing signal charges corresponding to incident light incoming along a predetermined path, a N-type HCCD region 18 formed integrally in a zigzag form between adjacent states of the plurality of horizontally arranged N-type photodiodes 17 for transferring the signal charges being applied from the N-type photodiodes 17 in a single direction in response to two clock signals H$\phi$1 and H$\phi$2, a N-type shift register 19 formed under the last set of the horizontally arranged N-type photodiodes 17 and at output of the N-type HCCD region 18 for reversing flowing of the signal charges outputted from the N-type HCCD region 18 in the opposite direction in response to a clock signal $\phi$s, a signal processing region 20 for storing temporarily the signal charges from the N-type HCCD region 18 or the signal charges from the N-type shift register 19 and then resetting the signal charges, and a sensing amplifier 21 for sensing states of the signal charges being temporarily stored in the signal processing region 20 and amplifying the sensed states of the signal charges by a predetermined amplification degree.

Figure 3:
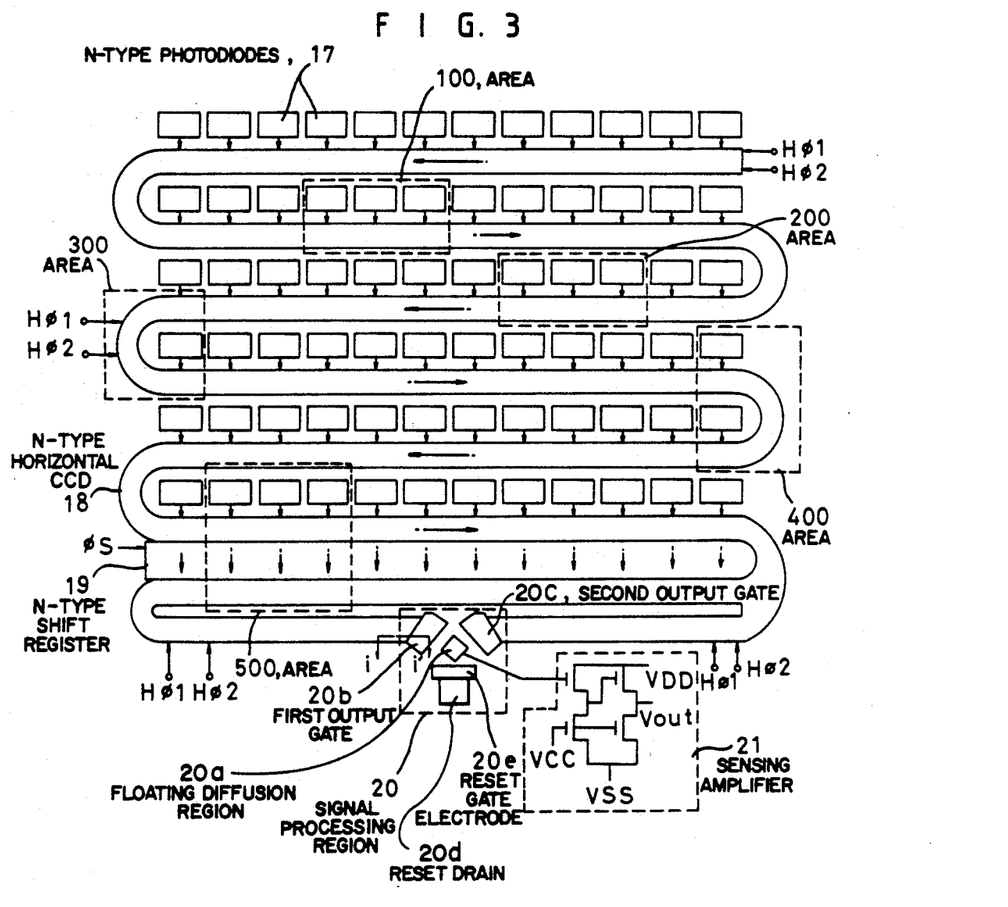
FIG. 3 is a schematic diagram of a construction of a CCD image sensor of the present invention.

The signal processing region 20 includes a floating diffusion region 20a for storing temporarily the inputted signal charges, first and second output gates 20b and 20c for transferring the signal charges from the shift register 19 and the N-type HCCD region 18 to the floating diffusion region 20a respectively, a reset drain 20d for resetting the signal charges being temporarily stored in the floating diffusion region 20a in response to a reset clock signal R$\phi$, and reset gate electrode 20e for applying the reset clock signal R$\phi$ to the reset drain 20d.

Figure 4A:
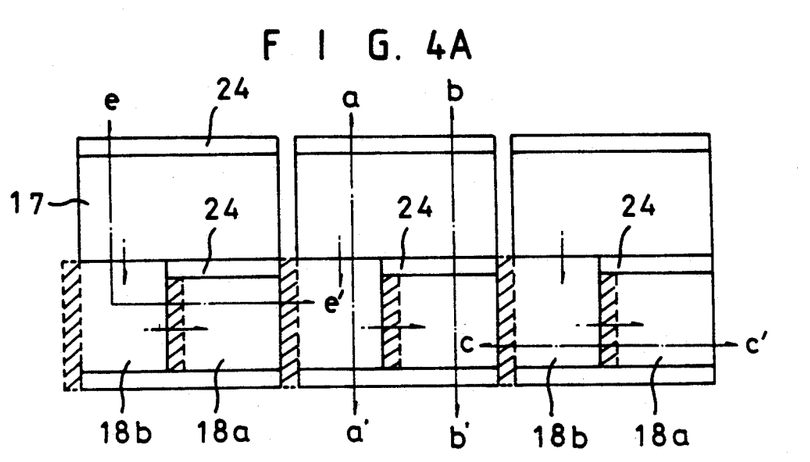
FIG. 4A is an enlarged, detailed diagram of an area 100 in FIG. 3.

With reference to FIG. 4A, there is shown an enlarged, detailed diagram of an area 100 in FIG. 3, corresponding to the N-type photodiodes 17 arranged on an even horizontal line and the N-type HCCD region 18 under the N-type photodiodes 17 on the even horizontal line. As shown in FIG. 4A, to each of the N-type photodiodes arranged on the even horizontal line are in order connected first and second gate electrodes 18a and 18b formed at the upper side of the N HCCO region 18.

Figure 4B:
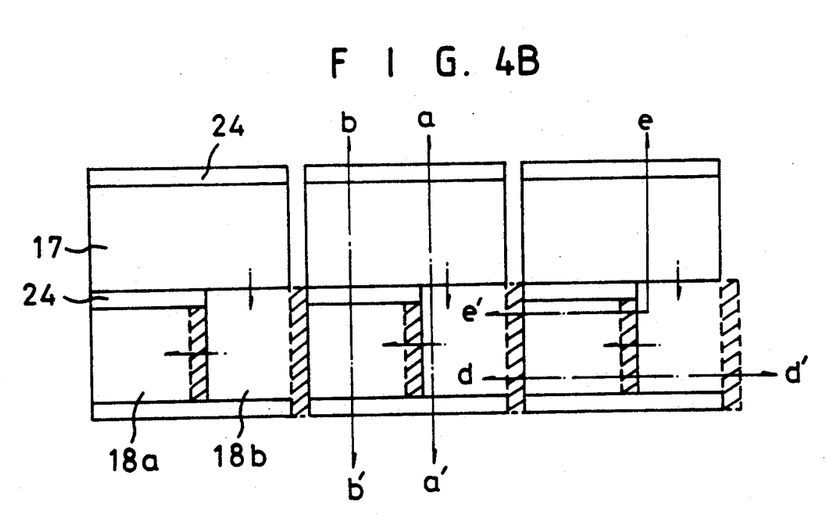
FIG. 4B is an enlarged, detailed diagram of an area 200 in FIG. 3.

As shown in FIG. 4B, there is shown an enlarged, detailed diagram of area 200 in FIG. 3, corresponding to the N-type photodiodes 17 arranged on an odd horizontal line and the N-type HCCD region 18 under the N-type photodiodes 17 on the odd horizontal line. The construction shown in this drawing is the same as that shown in FIG. 4A, with the exception that the first and second gate electrodes 18a and 18b of the N-type HCCD region 18 are reversed in the position.

Figure 4C:
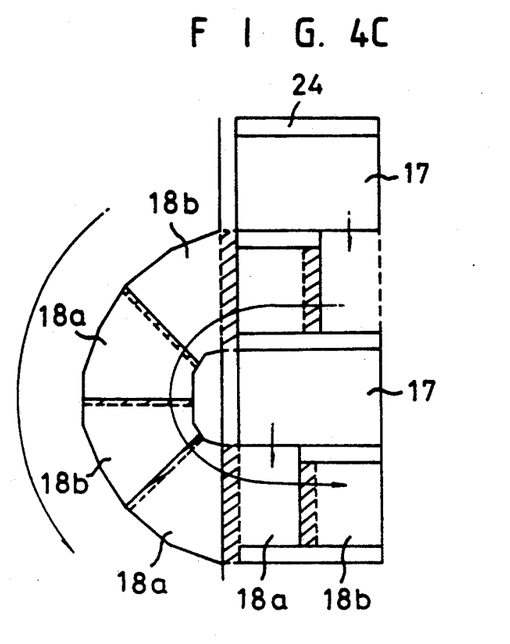
FIG. 4C is an enlarged, detailed diagram of an area 300 in FIG. 3.

With reference to FIG. 4C, there is shown an enlarged, detailed diagram of area 300 in FIG. 3, corresponding to the upper side of the N-type HCCD region 18 proceeding from the odd horizontal line on which the N-type photodiodes 17 are arranged to the even horizontal line on which the N-type photodiodes 17 are arranged. As shown in this drawing, the number of first and second gate electrodes 18a and 18b in the N-type HCCD region 18 are equal.

Figure 4D:
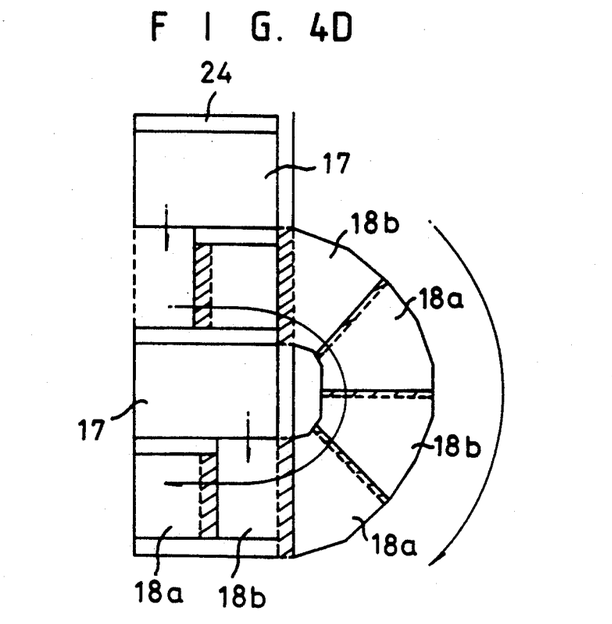
FIG. 4D is an enlarged, detailed diagram of an area 400 in FIG. 3.

As shown in FIG. 4D, there is shown an enlarged, detailed diagram of area 400 in FIG. 3, corresponding to the upper side of the N-type HCCD region 18 proceeding from the even horizontal line on which the N-type photodiodes 17 are arranged to the odd horizontal line on which the N-type photodiodes 17 are arranged. As shown in FIG. 4D, similar to the construction in FIG. 4C, the number first and second gate electrodes 18a and 18b of the N-type HCCD region 18 are equal.

Figure 4E:
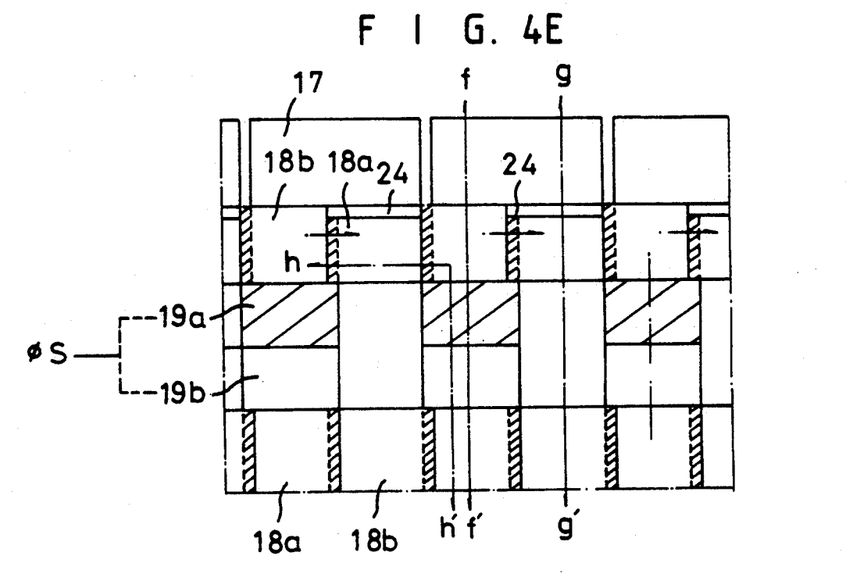
FIG. 4E is an enlarged, detailed diagram of an area 500 in FIG. 3.

With reference to FIG. 4E, there is shown an enlarged, detailed diagram of area 500 in FIG. 3, corresponding to the N-type photodiodes 17 arranged on the last horizontal line, the N-type shift register 19 formed under the N-type photodiodes 17 arranged on the last horizontal line and the upper side of the N-type HCCD region 18 formed above and under the shift register 19. As shown in FIG. 4E, the output of each of the N-type photodiodes 17 which are connected the second gate electrodes 18b of the N-type HCCD region 18 formed above the shift register 19, which are connected to a first gate electrode 19a of the shift register 19, which are connected to a second gate electrode 19b of the shift register 19 and the first gate electrode 18a of the N-type HCCD region 18 formed under the shift register 19.

The hatched portions in FIGS. 4A–4E indicate an N-type barrier layers 25 for forming potential barriers facilitating the transfer of the signal charges.

Figure 5A:
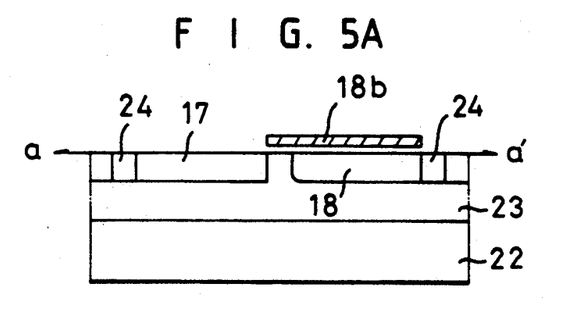
FIG. 5A is a sectional view, taken along line a—a in FIGS. 4A and 4B.

As shown in FIG. 5A, there is shown a sectional view, taken along line a—a' in FIGS. 4A and 4B. As shown in this drawing, on a N-type epitaxial layer 22 is formed a P-type well 23, on the surface of which are formed the N-type photodiode 17 and the N-type HCCD region 18. The second gate electrode 18b is formed at the upper side of the N-type HCCD region 18 beginning with the output of the N-type photodiode 17. Also, a channel stop layer 24 is formed between each of the N-type photodiodes 17.

Figure 5B:
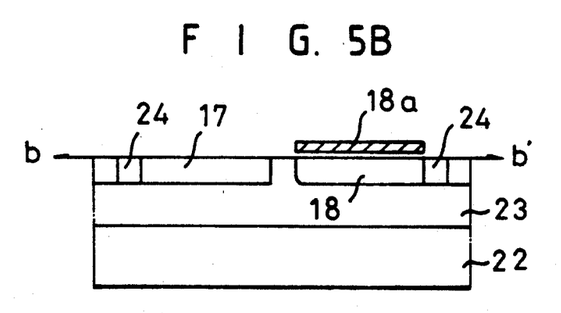
FIG. 5B is a sectional view, taken along line b—b' in FIGS. 4A and 4B.

Referring in detail to FIG. 5B, there is shown a sectional view, taken along line b—b' in FIGS. 4A and 4B. The construction shown in FIG. 5A, with the exception that the first gate electrode 18a is formed only at the upper side of the N-type HCCD region 18 in place of the second gate electrode 18b.

Figure 5C:
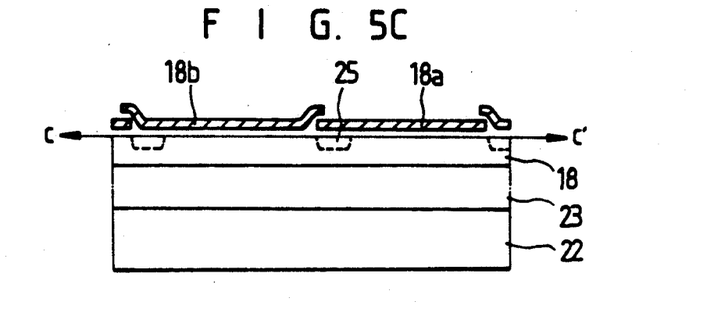
FIG. 5C is a sectional view, taken along line c—c' in FIG. 4A.

With reference to FIG. 5C, there is shown a sectional view, taken along line c—c' in FIG. 4A. As shown in this drawing, on the N-type epitaxial layer 22 is formed the P-type well 23, on which is formed the N-type HCCD region 18. The first and second gate electrodes 18a and 18b are formed at the upper side of the N-type HCCD region 18 in an interconnection form. On the surface of the N-type HCCD region 18, the N-type barrier layers 25 are formed on portions corresponding to left lower sides of the first and second gate electrodes 18a and 18b for the forming of potential barriers.

Figure 5D:
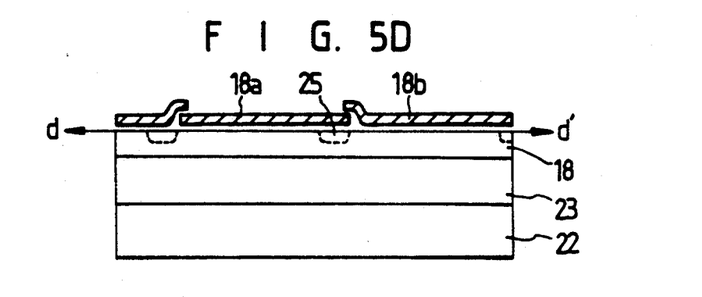
FIG. 5D is a sectional view, taken along line d—d' in FIG. 4B.

As shown in FIG. 5D, a sectional view, taken along d—d' in FIG. 4B, an N type barrier layer is formed respectively below the first gate electrode (18a) and the second gate electrode (18b). The construction shown in this drawing is the same as that shown in FIG. 5C, with the exception that the first and second gate electrodes 18a and 18b are reversed in position.

Figure 5E:
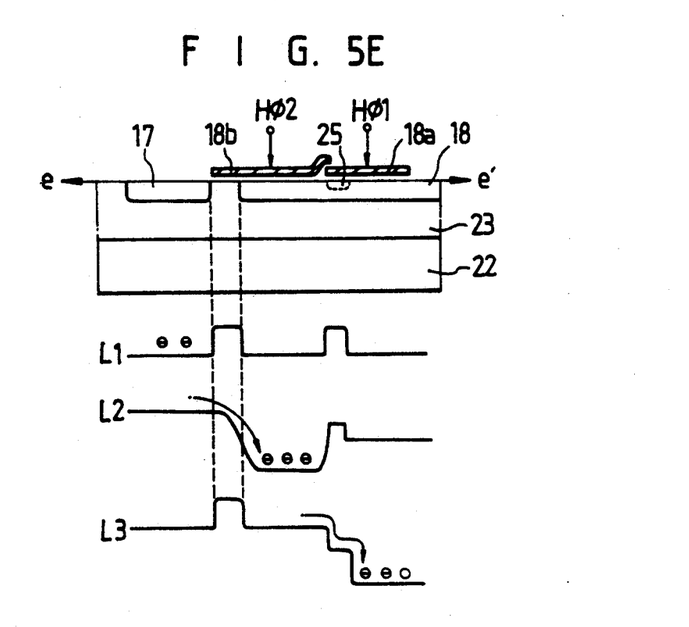
FIG. 5E is a sectional view, in addition to the illustration of potential profiles, taken along line e—e' in FIG. 4B.
Figure 6A:
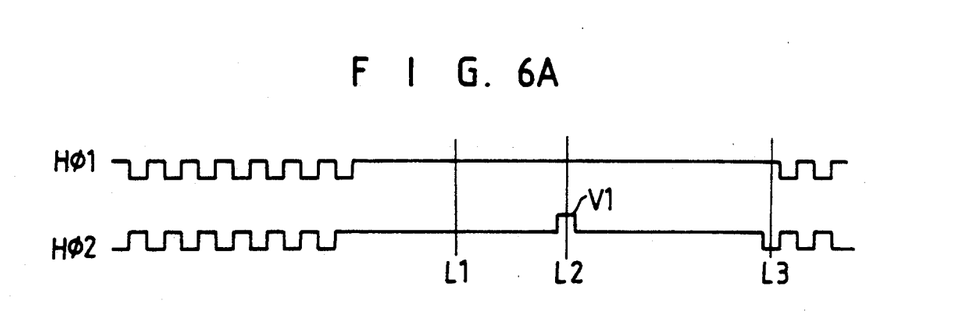
FIG. 6A through 6e are timing diagrams of clock signals in the CCD image sensor of the present invention in FIG. 3.

Referring in detail to FIG. 5E, there is shown a sectional view, in addition to the illustration of potential profiles, taken along line e—e' in FIG. 4B. As shown in FIG. 5E, there is illustrated a state where the signal charge is transferred from the N-type photodiode 17 to the N-type HCCD region 18 in accordance with the timing operation of the clock signals as shown in FIG. 6A.

Figure 5F:
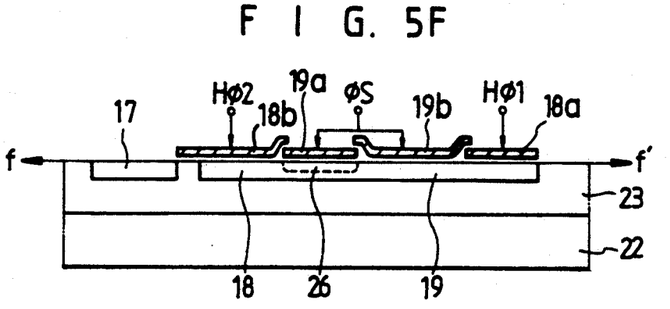
FIG. 5F is a sectional view, taken along line f—f' in FIG. 4E.

With reference to FIG. 5F, there is shown a sectional view, taken along line f—f' in FIG. 4E. As shown in FIG. 5F, on the N-type epitaxial layer 22 is formed the P-type well 23, on which is formed the N-type photodiode 17 being spaced apart at a desired interval from the N-type HCCD region 18 and the N-type shift register 19, these being integrally formed with each other. At the upper side of the integrally formed N-type HCCD region 18 and N-type shift register 19 are in order formed, the second gate electrode 18b of the N-type HCCD region 18, the first gate electrode 19a of the N-type shift register 19, the second gate electrode 19b of the N-type shift register 19 and the first gate electrode 18a of the N-type HCCD region 18, beginning with the output of the N-type photodiode 17. On the surface of the N-type shift register 19, a N-type barrier layer 26 is formed on a portion corresponding to the lower side of the first gate electrode 19a for the forming of potential barrier.

Figure 5G:
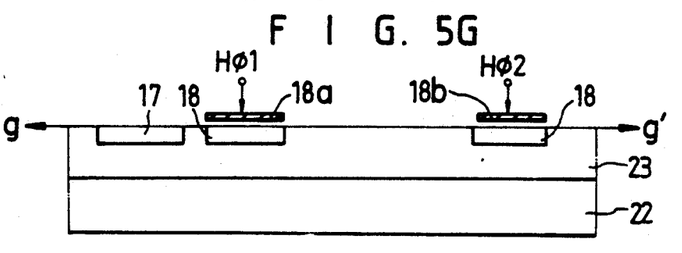
FIG. 5G is a sectional view, taken along line g—g' in FIG. 4E.

As shown in FIG. 5G, there is shown a sectional view, taken along line g—g' in FIG. 4E. As shown in this drawing, on the N-type epitaxial layer 22 is formed the P-type well 23, on the surface of which are formed the N-type photodiode 17 and the N-type HCCD region 18 being spaced apart at a desired interval from each other. Also, the first and second gate electrodes 18a and 18b of the N-type HCCD region 18 are reversed in the position as shown in FIG. 5F. Referring to FIGS. 5F and 5G, it is noted that the N-type shift register 19 is connected with the N-type HCCD region 18 through the lower side of the second gate electrode 18b of the N-type HCCD region 18, not via the lower side of the first gate electrode 18a of the N-type HCCD region 18.

Figure 5H:
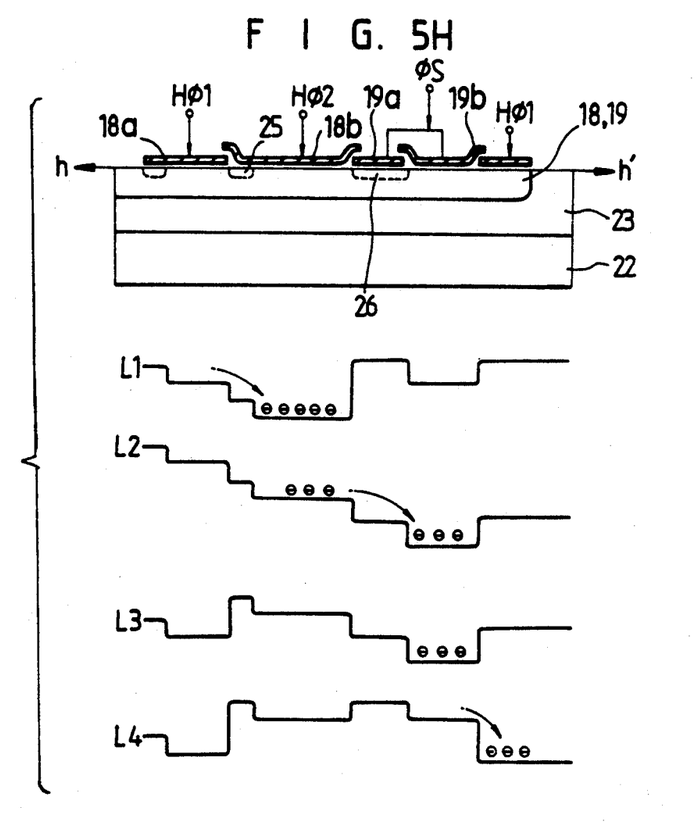
FIG. 5H is a sectional view, in addition to the illustration of potential profiles, taken along line h—h' in FIG. 4E.
Figure 6B:
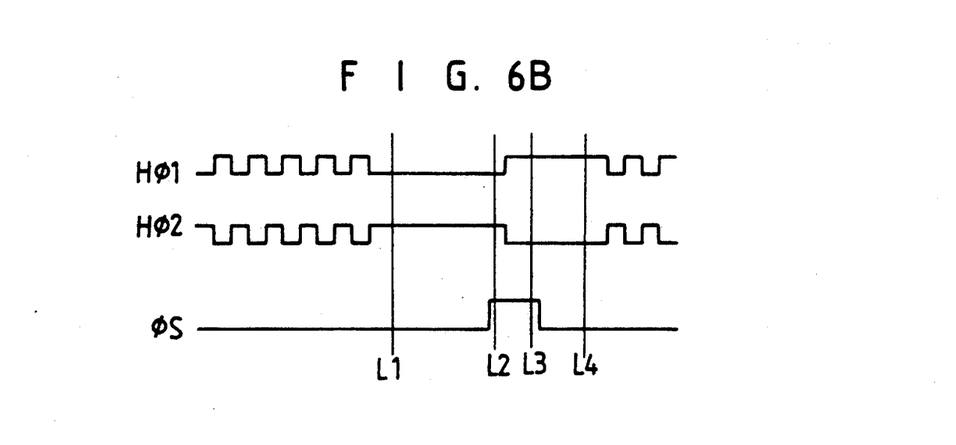
Figure 6C:
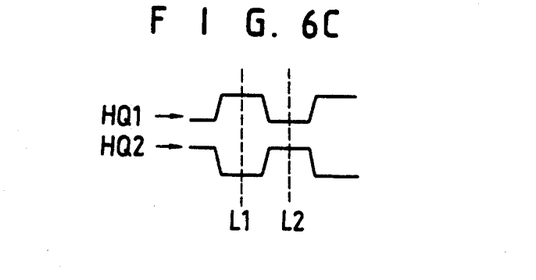

With reference to FIG. 5H, there is shown a sectional view, in addition to the illustration of potential profiles, taken along line h—h' in FIG. 4E. As shown in FIG. 5H, there is illustrated a state where the signal charge being outputted from the N-type HCCD region 18 is transferred through the N-type shift register 19 in accordance with the timing operation of the clock signals as shown in FIG. 6B. Referring to FIGS. 4E and 5H, it is noted that the signal charges from the N-type photodiodes 17 arranged on the odd horizontal line are directly transferred through the N-type HCCD region 18, but the signal charges from the N-type photodiodes 17 arranged on the even horizontal line are reversed in the flowing direction by the N-type shift register 19 and are then transferred to the signal processing region 20.

Figure 5I:
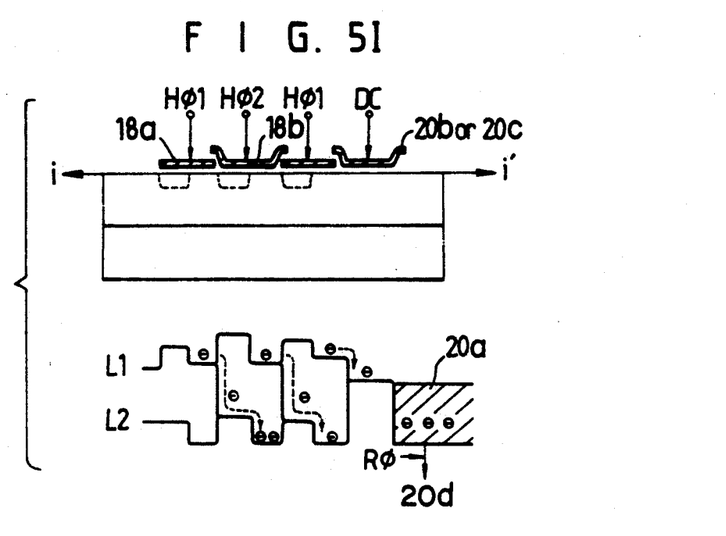
FIG. 5I is a sectional view, in addition to the illustration of potential profiles, taken along line i—i' in FIG. 3.

Referring in detail to FIG. 5I, there is shown a sectional view, in addition to the illustration of potential profiles, taken along line i—i' in FIG. 3. As shown in FIG. 5I, the signal charges from the shift register 19 are transferred to the floating diffusion region 20a by the first and second output gates 20b and 20c. The signal charges being temporarily stored in the floating diffusion region 20a exit via the reset drain 20d in response to the reset clock signal R$\phi$.

Herein, materials of the first and second gate electrodes 18a and 18b of the N-type HCCD region 18 and the first and second gate electrodes 19a and 19b of the N-type shift register 19 may be polysilicons.

Figure 6D:
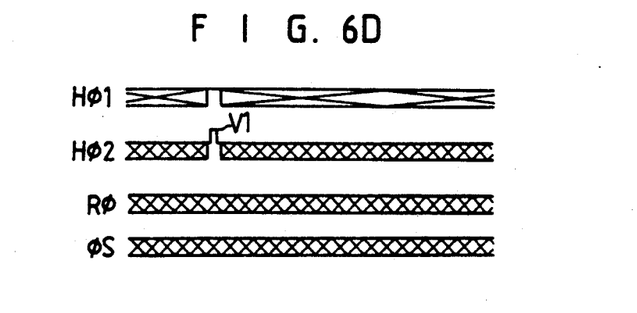
Figure 6E:
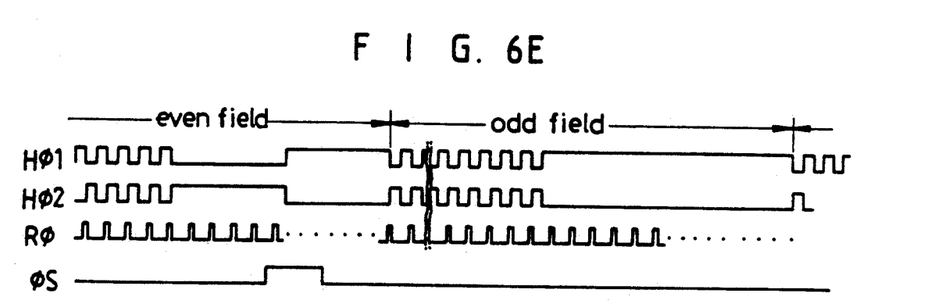

FIG. 6D is a timing diagram of clock signals with respect to one frame unit and FIG. 6E is a timing diagram of clock signals with respect to the N-type photodiodes 17 arranged on the odd or even horizontal line.

With reference to FIG. 6D, the signal charges from all of the N-type photodiodes 17 are transferred to the N-type HCCD region 18 by a drive voltage V1 contained in the clock signal H$\phi$2 being applied to the second gate electrode 18b of the N-type HCCD region 18.

Referring in detail to FIG. 6E, it is noted that the signal charges from the N-type photodiodes 17 arranged on the odd horizontal line are directly transferred to the floating diffusion region 20a, but the signal charges from the N-type photodiodes arranged on the even horizontal line are reversed in the flowing direction by the N-type shift register 19 in response to the shift clock signal $\phi$s and are then transferred to the floating diffusion region 20a.

The CCD image sensor with the above-mentioned construction in accordance with the present invention operates as follows.

First, upon receiving incident light corresponding to image, the N-type photodiodes 17 produce signal charges corresponding to the incident light. The signal charges from the N-type photodiodes 17 are transferred to the N-type HCCD region 18 by the drive voltage V1 in the clock signal H$\phi$2 being applied to the second gate electrode 18b and are then moved toward the output of the N-type HCCD region 18 in response to the clock signals H$\phi$1 and H$\phi$2 as shown in FIG. 5E. That is, the signal charges arrive at a position of the N-type HCCD region 18 corresponding to the end of the horizontal line, on which the N-type photodiodes 17 are arranged, are moved toward a position of the N-type HCCD region 18 corresponding to the next horizontal line, on which the N-type photodiodes 17 are arranged, along the round portion of the N-type HCCD region 18 as shown in FIGS. 4C and 4D.

Upon arriving at a position of the N-type HCCD region corresponding to the last horizontal line on which the N-type photodiodes 17 are arranged, the signal charges are reversed in the flowing direction by the N-type shift register 19 being applied with the shift clock signal $\phi$s and are then transferred to the floating diffusion region 20a through the first output gate 20b in the signal processing region 20, or are transferred directly to the floating diffusion region 20a through the second output gate 20c in the signal processing region 20 as shown in FIG. 5H.

In other words, as shown in FIG. 3, the signal charges from the N-type photodiodes 17 arranged on the odd horizontal line are moved to the left and the signal charges from the N-type photodiodes 17 arranged on the even horizontal line are moved to the right. In order to produce an accurate display, the signal charges from the N-type photodiodes 17 on the odd and even horizontal lines must be equal to each other in the flowing directions. As a result, as shown in FIG. 3, the signal charges from the N-type photodiodes 17 arranged on the even horizontal line are reversed from the right to the left in the flowing direction by the N-type shift register 19 being applied with the shift clock signal $\phi$s and are then transferred through the first output gate 20b in the signal processing region 20, while the signal charges from the N-type photodiodes 17 arranged on the odd horizontal line are transferred directly through the second output gate 20c in the signal processing region 20.

As shown in FIG. 6, when the signal charges from the N-type photodiodes 17 arranged on the odd horizontal line are arrived at the output of the N-type HCCD region 18, the shift clock signal $\phi$s is low, resulting in the forming of high potential barrier. For this reason, the signal charges from the N-type photodiodes 17 arranged on the odd horizontal line are transferred directly through the second output gate 20c. On the other hand, when the signal charges from the N-type photodiodes 17 arranged on the even horizontal line are arrived at the output of the N-type HCCD region 18, the shift clock signal φs is high, resulting in the forming of low potential barrier. As a result, the signal charges from the N-type photodiodes 17 arranged on the even horizontal line are reversed in the flowing direction by the N-type shift register 19 being applied with the shift clock signal φs and are then transferred through the first output gate 20b to the floating diffusion region 20a.

As a result, only during a horizontal blanking interval wherein the clock signals Hφ1 and Hφ2 being applied to the N-type HCCD region 18 maintain desired DC levels in the even field, are the signal charges from the N-type photodiodes 17 arranged on the even horizontal line moved to the N-type shift register 19.

As result, the signal charges from the N-type photodiodes 17 arranged on the odd and even horizontal lines are not transferred through both of the first and second output gates 20b and 20c at one time, but through only one of the first and second output gates 20b and 20c, and the transferred signal charges are collected in order in the floating diffusion region 20a.

The signal charges collected in the floating diffusion region 20a are temporarily stored therein and then exit via the reset drain 20d in response to the reset clock signal Rφ being applied to the reset gate electrode 20e as shown in FIG. 5I. At this time, the sensing amplifier 21 senses the states of the signal charges being temporarily stored in the floating diffusion region 20a in the signal processing region 20 and amplifies the sensed states of the signal charges by a predetermined amplification degree.

In accordance with the present invention, the CCD image sensor may be applied to a system of the non-interlaced scanning type. Therefore, a transfer gate (not shown) is turned on one time per one frame by the drive voltage V1 as shown in FIG. 6D. This transfer gate corresponds to a portion of the second gate electrode 18b on the P-type well between the N-type photodiode 17 and the N-type HCCD region 18.

As hereinbefore described, in accordance with the present invention, there are utilized a total of four clock signals, two HCCD clock signal Hφ1 and Hφ2, one shift clock signal φs and one reset clock signal Rφ. Therefore, the CCD image sensor of the present invention has an advantage over the conventional CCD image sensor of the interline transfer type requiring a total of seven clock signals, four VCCD clock signals Vφ1–Vφ4, two HCCD clock signals Hφ1 and Hφ2 and one reset clock signal Rφ, in that its construction and clocking operation are simplified. Since the constructions of the peripheral devices for driving the CCD image sensor are simplified as a result of the above-mentioned construction in accordance with the present invention, the manufacturing cost is reduced in manufacturing a system utilizing the CCD image sensor. The CCD image sensor of the present invention may be applied to systems requiring a lower resolution, such as, for example, a popular CCD camera, a video phone which can hardly utilize a number of pixels due to the use of telephone line, a toy set which requires recognition of an appearance of an object and a machine-vision system of the non-interlaced scanning type which requires recognition of a position and a direction of the object.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A charge coupled device image sensor comprising:
    a plurality of uniformly spaced photodetecting means arranged in series in the vertical and horizontal directions, for producing signal charges corresponding to incident light incoming along a predetermined path,
    horizontal signal transferring means formed integrally in a zigzag form between adjacent sets of said plurality of uniformly spaced photodetecting means in series in the horizontal direction for transferring the signal charges being applied from said plurality of uniformly spaced photodetecting means in a single direction in response to first and second external clock signals,
    signal flowing direction changing means formed under the last set of said plurality of uniformly spaced photodetecting means in series in the horizontal direction and at output of said horizontal signal transferring means for selectively reversing a flow of the signal charges outputted from said horizontal signal transferring means in the opposite direction in response to a third external clock signal,
    signal processing means for storing temporarily the signal charges from said horizontal signal transferring means or the signal charges from said signal flowing direction changing means and then resetting the signal charges, and
    sense amplifying means for sensing states of the signal charges being temporarily stored in said signal processing means and amplifying the sensed states of the signal charges by a predetermined amplification degree;
    wherein said plurality of uniformly spaced photodetecting means, said horizontal signal transferring means and said signal flowing direction changing means are of the same conductive type as that of a substrate.

2. The image sensor as set forth in claim 1, wherein said horizontal signal transferring means including first and second gate electrodes formed in turn thereon, each being applied with said first and second clock signals, said second gate electrode transferring the signal charges from said plurality of photodetecting means to said horizontal signal transferring means in response to a driving signal of said second clock signal, said second gate electrode and said first gate electrode transferring the signal charges transferred by said second gate electrode to said output of said horizontal signal transferring means in response to said first clock signal.

3. The charge coupled device image sensor of claim 2, wherein materials of said first and second gate electrodes are polysilicons.

4. The charge coupled device image sensor of claim 1, wherein said horizontal signal transferring means includes uniformly spaced barrier layers formed thereon, said uniformly spaced barrier layers forming potential barriers for facilitating the transfer of the signal charges from said horizontal signal transferring means.

5. The charge coupled device image sensor of claim 1, wherein said signal processing means includes:
    a floating diffusion region for strong temporarily the inputted signal charges, a first output gate being biased with a constant DC voltage for transferring the signal charges from said horizontal signal transferring means to said floating diffusion region, a second output gate being biased with a constant DC voltage for transferring the signal charges from said signal flowing direction changing means to said floating diffusion region, a reset drain for resetting the signal charges being temporarily stored in said floating diffusion region in response to a fourth external clock signal, and a reset gate electrode for applying said fourth external clock signal to said reset drain.

6. The charge coupled device image sensor of claim 5, wherein said reset drain and said floating diffusion region are of the same conductive type.

7. The charge coupled device image sensor of claim 5, wherein materials of said first and second output gates and said reset gate electrode are polysilicons.

8. The charge coupled device image sensor of claim 1, wherein said signal flowing direction changing means includes third and fourth gate electrodes formed in turn on its surface, each being applied with said third external clock signal, said third gate electrode transferring the signal charges from the horizontal signal transferring means to said signal flowing direction changing means in response to said third external clock signal, said fourth gate electrode transferring the signal charges transferred by said third gate electrode to said signal processing means.

9. The charge coupled device image sensor of claim 8, wherein materials of said third and fourth gate electrodes are polysilicons.

10. The charge coupled device image sensor of claim 1, wherein said signal flowing direction changing means includes uniformly spaced barrier layers formed thereon, corresponding to below the second electrode, said uniformly spaced barrier layers forming potential barriers for facilitating the transfer of the signal charges from said horizontal signal transferring means.

11. The charge coupled device image sensor of claim 1, wherein said signal flowing direction changing means operates to reverse the signal charges from said plurality of uniformly spaced photodetecting means arranged on odd horizontal lines in the flowing direction and then transferring the signal charges to said signal processing means and said horizontal signal transferring means operates to transfer the signal charges from said plurality of photodetecting means arranged on said odd horizontal lines opposite to said signal flowing direction changing means directly to said signal processing means.

12. The charge coupled device image sensor of claim 1, wherein said signal flowing direction changing means operates to reverse the signal charges from said plurality of uniformly spaced photodetecting means arranged on even horizontal lines in the flowing direction and then transferring the signal charges to said signal processing means and said horizontal signal transferring means operates to transfer the signal charges from said plurality of photodetecting means arranged on said even horizontal lines opposite to said signal flowing direction changing means directly to said signal processing means.

* * * * *